US010374620B2

(12) United States Patent
Xue et al.

(10) Patent No.: US 10,374,620 B2
(45) Date of Patent: Aug. 6, 2019

(54) FREQUENCY DIVIDER CIRCUIT AND A FREQUENCY SYNTHESIZER CIRCUIT

(71) Applicants: Semiconductor Manufacturing International (Shanghai) Corporation, Shanghai (CN); Semiconductor Manufacturing International (Beijing) Corporation, Beijing (CN)

(72) Inventors: Pandou Xue, Shanghai (CN); Guangtao Feng, Shanghai (CN)

(73) Assignees: SEMICONDUCTOR MANUFACTURING INTERNATIONAL (SHANGHAI) CORPORATION (CN); SEMICONDUCTOR MANUFACTURING INTERNATIONAL (BEIJING) CORPORATION (CN)

( * ) Notice: Subject to any disclaimer, the term of this patent is extended or adjusted under 35 U.S.C. 154(b) by 43 days.

(21) Appl. No.: 15/488,202

(22) Filed: Apr. 14, 2017

(65) Prior Publication Data

US 2017/0302286 A1    Oct. 19, 2017

(30) Foreign Application Priority Data

Apr. 18, 2016    (CN) .......................... 2016 1 0240684

(51) Int. Cl.
*H03L 7/18*    (2006.01)
*H03K 3/356*    (2006.01)
(Continued)

(52) U.S. Cl.
CPC .......... *H03L 7/18* (2013.01); *H03K 3/356113* (2013.01); *H03K 21/026* (2013.01); *H03K 21/10* (2013.01)

(58) Field of Classification Search
CPC .. H03L 7/18; H03K 3/356113; H03K 21/026; H03K 21/10; H03K 19/0963
See application file for complete search history.

(56) References Cited

U.S. PATENT DOCUMENTS 9,473,147 B2 * 10/2016 Chiu ...................... H03K 21/38
2008/0143399 A1 * 6/2008 Suda .................... H03L 7/0814
327/156

OTHER PUBLICATIONS

European Search Report, Application No. 17166520.1, dated Oct. 6, 2017, pp. 1-10.

(Continued)

*Primary Examiner* — Jung Kim
(74) *Attorney, Agent, or Firm* — Innovation Counsel LLP

(57) ABSTRACT

A frequency divider circuit and a frequency synthesizer circuit are presented, comprising:
first and second flip-flops;
a phase inverter, wherein an output electrode of the first flip-flop is connected to an input electrode of the second flip-flop and an output electrode of the phase inverter, an output electrode of the second flip-flop is connected to an input electrode of the phase inverter and an input electrode of the first flip-flop, a control electrode of the phase inverter is connected to a control signal; and
a control module, wherein the first flip-flop is connected to a voltage source through the control module, the control module is connected to the control signal and controls the connection between the first flip-flop and the voltage source. When the control signal is a first-mode signal, the first flip-flop is disconnected from the voltage source, providing a functionality of a N-division frequency divider. When both the control signal and an output signal of the second flip-flop are a
(Continued)

second-mode signal, a functionality of a N+1-division frequency divider is provided.

20 Claims, 6 Drawing Sheets

(51) Int. Cl.
*H03K 21/02* (2006.01)
*H03K 21/10* (2006.01)

(56) References Cited

OTHER PUBLICATIONS

Krishna et al., "Design and Analysis of Ultra Low Power True Single Phase Clock CMOS 2/3 Prescaler," IEEE Transactions on Circuits and Systems—I: Regular Papers, vol. 57, No. 1., Jan. 2010, pp. 1-11.
Soares, Jr., J. Navarro and W.A.M. Van Noije, "A 1.6-GHz Dual Modulus Prescaler Using the Extended True-Single-Phase-Clock CMOS Circuit Technique (E-TSPC)," IEEE Journal of Solid-State Circuits, vol. 34, No. 1, Jan. 1999, pp. 1-6.

\* cited by examiner

FREQUENCY DIVIDER CIRCUIT AND A FREQUENCY SYNTHESIZER CIRCUIT

CROSS-REFERENCE TO RELATED APPLICATION

This application claims priority to and benefit of Chinese Patent Application No. 201610240684.1 filed on Apr. 18, 2016, which is incorporated herein by reference in its entirety.

BACKGROUND

(a) Field of the Invention

This inventive concept relates to integrated circuits, more specifically, a frequency divider and a frequency synthesizer.

(b) Description of the Related Art

Frequency Synthesis technique has been widely used in many technical fields such as wireless communication, wireless Local Area Network (LAN), digital television, and satellite global positioning system. Phase-Locked Loop (PLL) frequency synthesizer is a main stream frequency synthesizer. A PLL frequency synthesizer generates signals of adjustable frequency through programmable frequency dividers according to the requirements of the receiving and transmitting systems.

High speed dual-modular prescaler, which generates multiple frequency divisions using single frequency divider, is an important functional module in a PLL. Power consumption, operating speed, and available number of frequency division are main parameters of a prescaler. The prescaler has the highest operating speed among all the modules in a PLL, thus it typically consumes more power than any other modules, therefore it is desirable to design a prescaler with less power consumption without compromising its operating speed.

SUMMARY

This summary is related to some of many embodiments of the inventive concept disclosed herein and is not intended to limit the scope of this inventive concept.

A frequency divider circuit, comprising:
a first flip-flop;
a second flip-flop;
a phase inverter, wherein an output electrode of the first flip-flop is connected to an input electrode of the second flip-flop and an output electrode of the phase inverter, an output electrode of the second flip-flop is connected to an input electrode of the phase inverter and an input electrode of the first flip-flop, a control electrode of the phase inverter is connected to a control signal; and
a control module, wherein the first flip-flop is connected to a voltage source through the control module, the control module is connected to the control signal and controls the connection between the first flip-flop and the voltage source, wherein when the control signal is a first-mode signal, the first flip-flop is disconnected from the voltage source, providing a functionality of a N-division frequency divider; when both the control signal and an output signal of the second flip-flop are a second-mode signal, a functionality of a N+1-division frequency divider is provided.

Additionally, in the aforementioned circuit, the first flip-flop is a D flip-flop, and a first part of the first flip-flop comprises an Extended True Single-Phase Clock (E-TSPC) circuit.

Additionally, in the aforementioned circuit, a second part and a third part of the first flip-flop both comprise a dynamic D latch circuit with a True Single-Phase Clock (TSPC) circuit.

Additionally, in the aforementioned circuit, the control module comprises:
a first p-type Metal-Oxide-Semiconductor (pMOS) transistor, wherein a gate electrode of the first pMOS transistor is connected to the control signal, a drain electrode of the first pMOS transistor is connected to the first flip-flop, and a source electrode of the first pMOS transistor is connected to the voltage source.

Additionally, in the aforementioned circuit, the phase inverter comprises:
a first n-type Metal-Oxide-Semiconductor (nMOS) transistor;
a second nMOS transistor; and
a second pMOS transistor, wherein a source electrode of the first nMOS transistor is grounded, a drain electrode of the first nMOS transistor is connected to a source electrode of the second nMOS transistor, a gate electrode of the first nMOS transistor is connected a control electrode of the phase inverter, a drain electrode of the second nMOS transistor and a drain electrode of the second pMOS transistor are both connected to an output electrode of the phase inverter, a source electrode of the second pMOS transistor is connected to the voltage source, a gate electrode of the second pMOS transistor and a gate electrode of the second nMOS transistor are both connected to an input electrode of the phase inverter.

Additionally, in the aforementioned circuit, the second flip-flop is a D flip-flop with a TSPC circuit.

Additionally, in the aforementioned circuit, the first-mode signal is 1 and the second-mode signal is 0.

Additionally, in the aforementioned circuit, N is 2.

Additionally, in the aforementioned circuit, the first flip-flop comprises:
a third pMOS transistor; and
a third nMOS transistor, wherein a source electrode of the third nMOS transistor is grounded, a gate electrode of the third nMOS transistor is connected to an input electrode of the first flip-flop, a drain electrode of the third nMOS transistor is connected to a drain electrode of the third pMOS transistor, and both are connected to a first node, a gate electrode of the third pMOS transistor is connected to a timing signal, a source electrode of the third pMOS transistor is connected to a voltage node of the first flip-flop.

Additionally, in the aforementioned circuit, the first flip-flop further comprises:
a fourth nMOS transistor;
a fifth nMOS transistor; and
a fourth pMOS transistor, wherein a source electrode of the fourth nMOS transistor is grounded, a gate electrode of the fourth nMOS transistor is connected to the timing signal, a drain electrode of the fourth nMOS transistor is connected to a source electrode of the fifth nMOS transistor, a gate electrode of the fifth nMOS transistor is connected to the first node, the drain electrode of the fifth nMOS transistor and a drain electrode of the fourth pMOS transistor are both connected to a second node, a gate electrode of the fourth pMOS transistor is connected to the timing signal, a source electrode of the fourth pMOS transistor is connected to the voltage node.

Additionally, in the aforementioned circuit, the first flip-flop further comprises:
a sixth nMOS transistor;
a seventh nMOS transistor; and
a fifth pMOS transistor, wherein a source electrode of the sixth nMOS transistor is grounded, a gate electrode of the sixth nMOS transistor is connected to the timing signal, a drain electrode of the sixth nMOS transistor is connected to a source electrode of the seventh nMOS transistor, a drain electrode of the seventh nMOS transistor and a drain electrode of the fifth pMOS transistor are both connected to an output electrode of the first flip-flop, a gate electrode of the seventh nMOS transistor and a gate electrode of the fifth pMOS transistor are both connected to the second node, a source electrode of the fifth pMOS transistor is connected to the voltage node.

Additionally, in the aforementioned circuit, the second flip-flop further comprises:
an eighth nMOS transistor;
a sixth pMOS transistor; and
a seventh pMOS transistor, wherein a source electrode of the eighth nMOS transistor is grounded, a drain electrode of the eighth nMOS transistor and a drain electrode of the sixth pMOS transistor are both connected to a fourth node, a gate electrode of the eighth nMOS transistor and a gate electrode of the sixth pMOS transistor are both connected to an input electrode of the second D flip-flop, a source electrode of the sixth pMOS transistor is connected to a drain electrode of the seventh pMOS transistor, a source electrode of the seventh pMOS transistor is connected to the voltage source, a gate electrode of the seventh pMOS transistor is connected to the timing signal.

Additionally, in the aforementioned circuit, the second flip-flop further comprises:
a ninth nMOS transistor;
a tenth nMOS transistor; and
an eighth pMOS transistor, wherein a source electrode of the ninth nMOS transistor is grounded, a gate electrode of the ninth nMOS transistor is connected to the timing signal, a drain electrode of the ninth nMOS transistor is connected to a source electrode of the tenth nMOS transistor, a gate electrode of the tenth nMOS transistor is connected to the fourth node, a drain electrode of the tenth nMOS transistor and a drain electrode of the eighth pMOS transistor are both connected to a fifth node, a gate electrode of the eighth pMOS transistor is connected to the timing signal, a source electrode of the eighth pMOS transistor is connected to the voltage source.

Additionally, in the aforementioned circuit, the second flip-flop further comprises:
an eleventh nMOS transistor;
a twelfth nMOS transistor; and
a ninth pMOS transistor, wherein a source electrode of the eleventh nMOS transistor is grounded, a gate electrode of the eleventh nMOS transistor is connected to the timing signal, a drain electrode of the eleventh nMOS transistor is connected to a source electrode of the twelfth nMOS transistor, a gate electrode of the twelfth nMOS transistor and a gate electrode of the ninth pMOS transistor are both connected to the fifth node, a drain electrode of the twelfth nMOS transistor and a drain electrode of the ninth pMOS transistor are both connected to a sixth node, a source electrode of a ninth pMOS transistor is connected to the voltage source.

Additionally, in the aforementioned circuit, the second flip-flop further comprises:

a thirteenth nMOS transistor; and
a tenth pMOS transistor, wherein a gate electrode of the thirteenth nMOS transistor and a gate electrode of the tenth pMOS transistor are both connected to the sixth node, a source electrode of the thirteenth nMOS transistor is grounded, a drain electrode of the thirteenth nMOS transistor and a drain electrode of the tenth pMOS transistor are both connected to an output electrode of the second flip-flop, a source electrode of the tenth pMOS transistor is connected to the voltage source.

This inventive concept further presents a frequency synthesizer circuit, comprising:
a frequency divider circuit, wherein the frequency divider circuit comprises:
a first flip-flop;
a second flip-flop;
a phase inverter, wherein an output electrode of the first flip-flop is connected to an input electrode of the second flip-flop and an output electrode of the phase inverter, an output electrode of the second flip-flop is connected to an input electrode of the phase inverter and an input electrode of the first flip-flop, a control electrode of the phase inverter is connected to a control signal; and
a control module, wherein the first flip-flop is connected to a voltage source through the control module, the control module is connected to the control signal and controls the connection between the first flip-flop and the voltage source, wherein when the control signal is a first-mode signal, the first flip-flop is disconnected from the voltage source, providing a functionality of a N-division frequency divider; when both the control signal and an output signal of the second flip-flop are a second-mode signal, a functionality of a N+1-division frequency divider is provided.

Additionally, in the aforementioned circuit, the first flip-flop is a D flip-flop, and a first part of the first flip-flop comprises an Extended True Single-Phase Clock (E-TSPC) circuit.

Additionally, in the aforementioned circuit, a second order and a third order of the first flip-flop both comprise a dynamic D latch with a True Single-Phase Clock (TSPC) circuit.

Additionally, in the aforementioned circuit, the control module comprises:
a first pMOS transistor, wherein a gate electrode of the first pMOS transistor is connected to the control signal, the drain electrode of the first pMOS transistor is connected to the first flip-flop, a source electrode of the first pMOS transistor is connected to the voltage source.

Additionally, in the aforementioned circuit, the phase inverter comprises:
a first nMOS transistor;
a second nMOS transistor; and
a second pMOS transistor, wherein a source electrode of the first nMOS transistor is grounded, a drain electrode of the first nMOS transistor is connected to a source electrode of the second nMOS transistor, a gate electrode of the first nMOS transistor is connected to a control electrode of the phase inverter, a drain electrode of the second nMOS transistor and a drain electrode of the second pMOS transistor are both connected to an output electrode of the phase inverter, a source electrode of the second pMOS transistor is connected to the voltage source, a gate electrode of the second pMOS transistor and a gate electrode of the second nMOS transistor are both connected to an input electrode of the phase inverter.

DETAILED DESCRIPTION OF THE EMBODIMENTS

Figure 1:
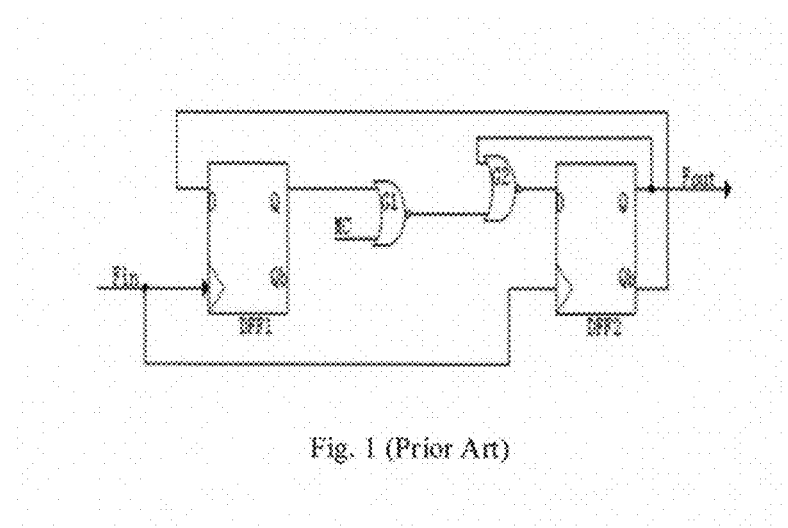
FIG. 1 (Prior Art) shows a schematic diagram of a conventional 2/3 division frequency divider.

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but do not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

FIG. 1 depicts a schematic diagram of a conventional 2/3 division frequency divider. This frequency divider comprises two True Single-Phase Clock D flip-flops (TSPC DFF) circuits and two logical NOR gate circuits. When a control signal MC is 1, it works as a 2-division frequency divider; when the control signal MC is 0, it works as a 3-division frequency divider.

Figure 2:
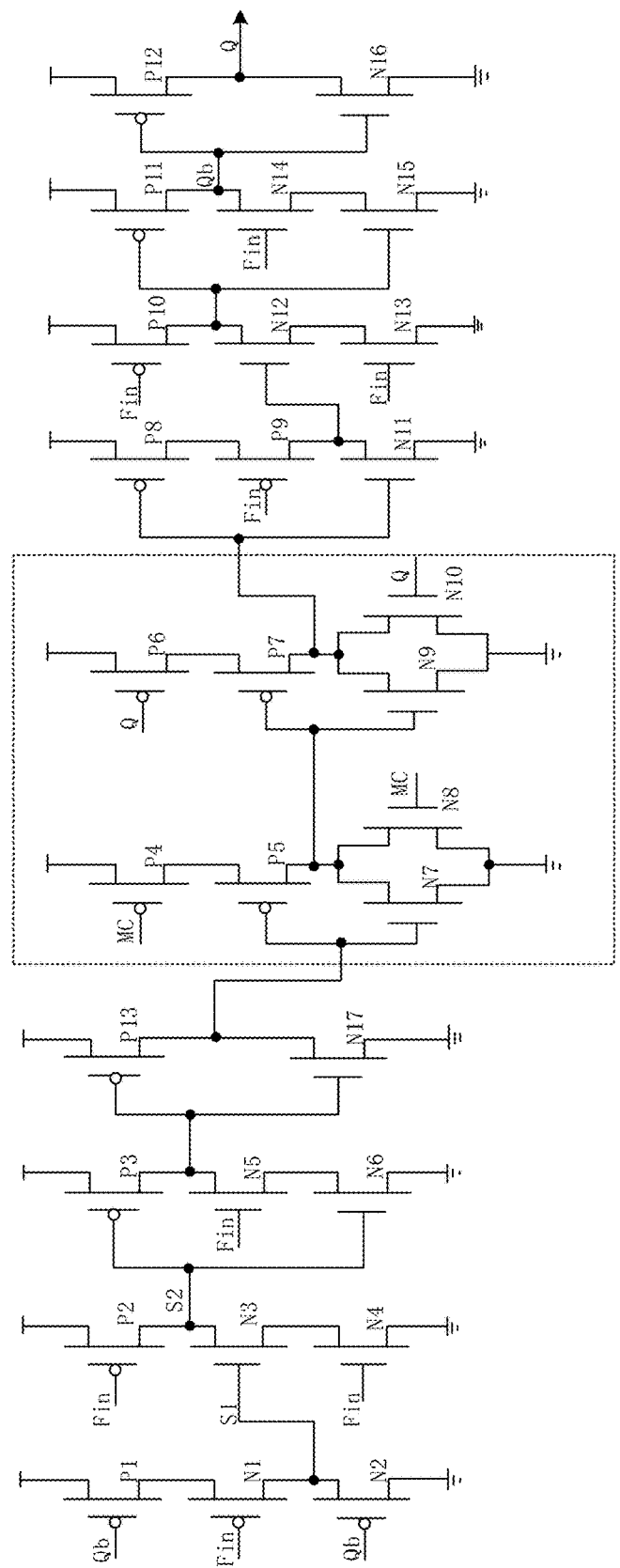
FIG. 2 (Prior Art) shows a circuit diagram of a conventional 2/3 division frequency divider.

FIG. 2 depicts a circuit diagram of a conventional 2/3 division frequency divider. The frequency divider comprises two TSPC DFFs—one on the left side of the dotted box (DFF1) and one on the right side of the dotted box (DFF2). As shown in FIG. 2, the electrical load of DFF1 is a logical NOR gate circuit, the electrical load of DFF2 is DFF1, a logical NOR gate circuit, and an output. Large electrical load on DFF2 results in huge power consumption and limits the operating speed of the circuit.

Figure 3:
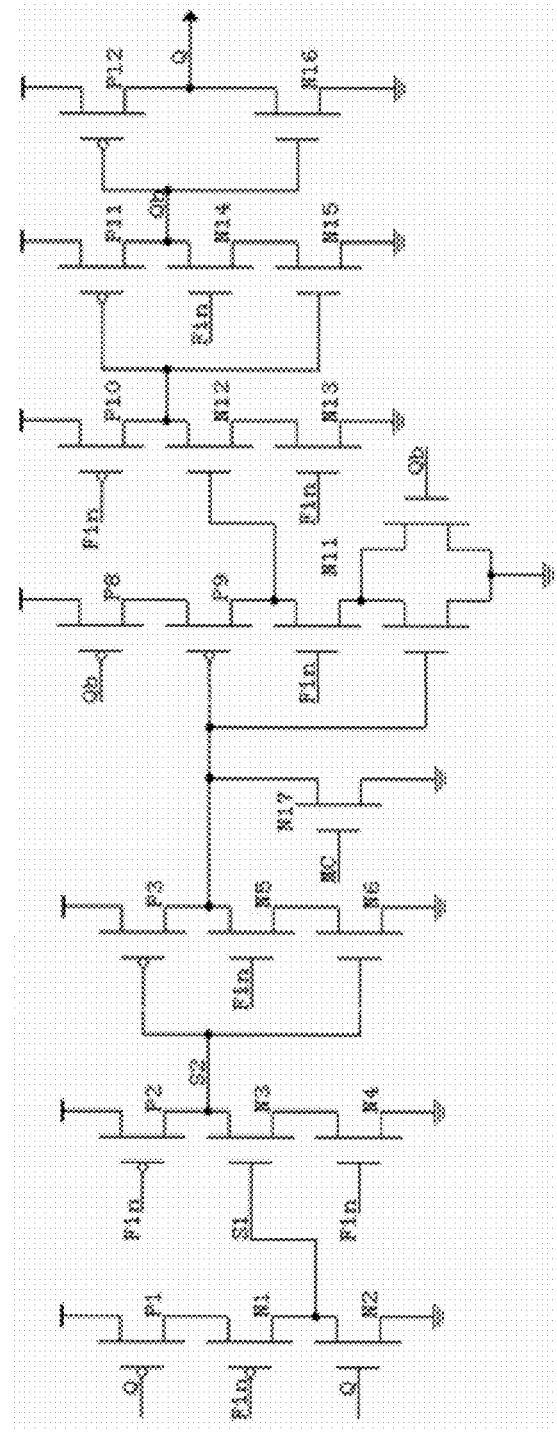
FIG. 3 (Prior Art) shows a circuit diagram of a conventional 2/3 division frequency divider, wherein a D flip-flop in the frequency divider comprises a logical NOR gate circuit.

FIG. 3 depicts a circuit diagram of a conventional 2/3 division frequency divider, wherein a D flip-flop (DFF) in the frequency divider comprises a logical NOR gate circuit. As shown in FIG. 3, an n-type Metal-Oxide-Semiconductor (nMOS) transistor N2 connects a first NOR gate circuit of a conventional 2/3 division frequency divider to a third part of DFF1, the nMOS transistor N2 also connects a second NOR gate circuit of a conventional 2/3 division frequency divider to a first part of DFF2. This design reduces number of notes in the frequency divider and thus reduces the power consumption. However, when working in 2-division mode, DFF1 still connects to the circuit and incurs power consumption. This part of power consumption is unnecessary.

This inventive concept presents an innovative frequency divider circuit that operates with low power consumption. The frequency divider of this inventive concept comprises a first flip-flop, a second flip-flop, and a phase inverter. An output electrode of the first flip-flop is connected to an input electrode of the second flip-flop and an output electrode of the phase inverter, an output electrode of the second flip-flop is connected to an input electrode of the phase inverter and an input electrode of the first flip-flop, a control electrode of the phase inverter is connected to a control signal.

The first flip-flop is connected to a voltage source through a control module, the control module is connected to the control signal and controls the connection between the voltage source and the first flip-flop.

When the control signal is a first-mode signal, the first flip-flop is disconnected from the voltage source, only the second flip-flop is connected and working in the circuit, and the frequency divider works in a N-division mode. When both the control signal and an output signal of the second flip-flop are a second-mode signal, the logic high in the output signal of the second flip-flop will be extended by one additional clock cycle, the frequency divider works in a N+1-division mode.

The first flip-flop and the second flip-flop can be a D flip-flop or a T flip-flop. It may also be any other electrical circuits or elements that can provide the same functionality of the first and the second flip-flops in the circuit. In some embodiments, the first flip-flop and the second flip-flops can be D flip-flops.

In one embodiment, the first flip-flop is a D flip-flop, a first part of the first flip-flop comprises an Extended True Single-Phase Clock (E-TSPC) circuit to provide clock frequency, and a second part and a third part of the first flip-flop both comprise a dynamic D latch with a TSPC circuit.

In one embodiment, the second flip-flop is a D flip-flop with a TSPC circuit.

Additionally, both the first and the second flip-flops also comprise a timing electrode that is connected to a timing signal Fin.

The circuit of the phase inverter can be any phase inverter circuit that is well known to a person of ordinary skills in the art, or any other circuit that can change the phase of an input signal by 180 degree. The phase inverter of this inventive concept is also controlled by the control signal.

In one embodiment, the phase inverter comprises two nMOS transistors and one p-type Metal-Oxide-Semiconductor (pMOS) transistor. A gate electrode of one of these two nMOS transistors is connected to a control electrode of the phase inverter, which is also connected to a control signal MC, an input electrode of the phase inverter is connected to an output electrode of the second flip-flop, an output electrode of the phase inverter is connected to an output electrode of the first flip-flop and an input electrode of the second flip-flop. When the control signal MC is 1, the phase inverter works normally; when the control signal MC is 0, two nMOS transistors in the phase inverter are in a cutoff state, the pMOS transistor will be in a conducting state only when the output signal of the second flip-flop is 0.

The control module is connected to the control signal MC and controls the connection between the first flip-flop and the voltage source. In one embodiment, the control module is a pMOS transistor, wherein a gate electrode, a source electrode and a drain electrode of the pMOS transistor are connected to the control signal MC, the voltage source, and the first flip-flop, respectively. When the control signal MC is a first-mode signal (e.g. 1), the pMOS transistor is in a cutoff state, thus the first flip-flop is disconnected from the voltage source. The implementation of the control module is not limited to what is described in this embodiment, other control circuits that can control the connection between the first flip-flop and the voltage source with a control signal can also be used as the control module in this inventive concept.

Additionally, the same control signal can connect to both the control module and the phase inverter.

In this embodiment, N is an integer that is equal to or larger than 2. Ideally, N can be set at 2, then this frequency divider works as a 2/3 division frequency divider, or a dual-modular frequency divider.

When the control signal MC is the first-mode signal (e.g. 1), the first flip-flop is disconnected from the voltage source by the control module, only the second flip-flop is connected to the circuit, the frequency divider works as a 2-division frequency divider. When both the control signal MC and the output signal of the second flip-flop are the second-mode signal (e.g. 0), the two nMOS transistors in the phase inverter are in a cutoff state and the pMOS transistor in the phase inverter is in a conducting state, which extends the logic high in the output signal of the second flip-flop by one additional clock cycle, the frequency divider works as a 3-division frequency divider.

The frequency divider of this inventive concept eliminates the logical OR gate circuit in conventional frequency dividers. The transition from 2-division mode to 3-division mode is controlled by extending the logic high in the output signal by one additional clock cycle, therefore the power consumption of the frequency divider can be reduced.

A First Embodiment

Figure 4:
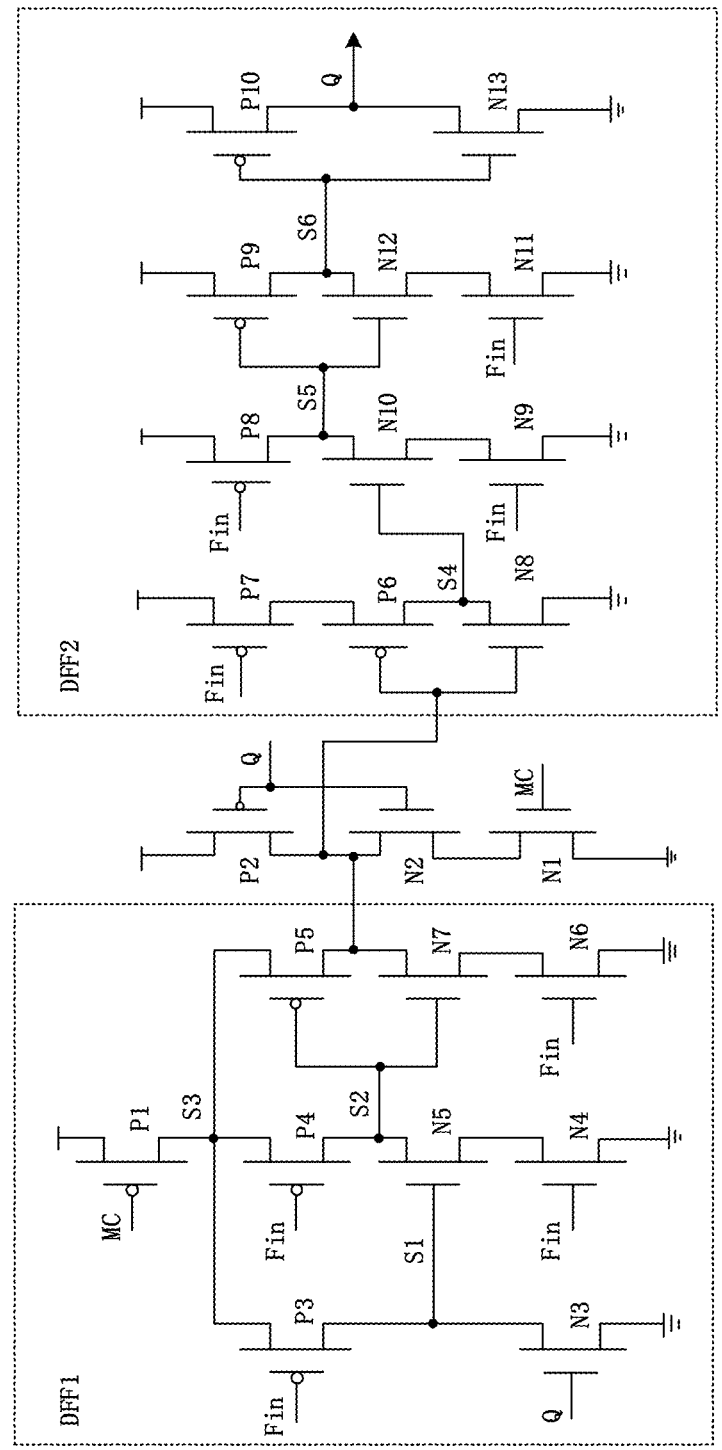
FIG. 4 shows a circuit diagram of a low power consumption True Single-Phase Clock (TSPC) 2/3 division frequency divider in accordance with one or more embodiments of the inventive concept.
Figure 5A:
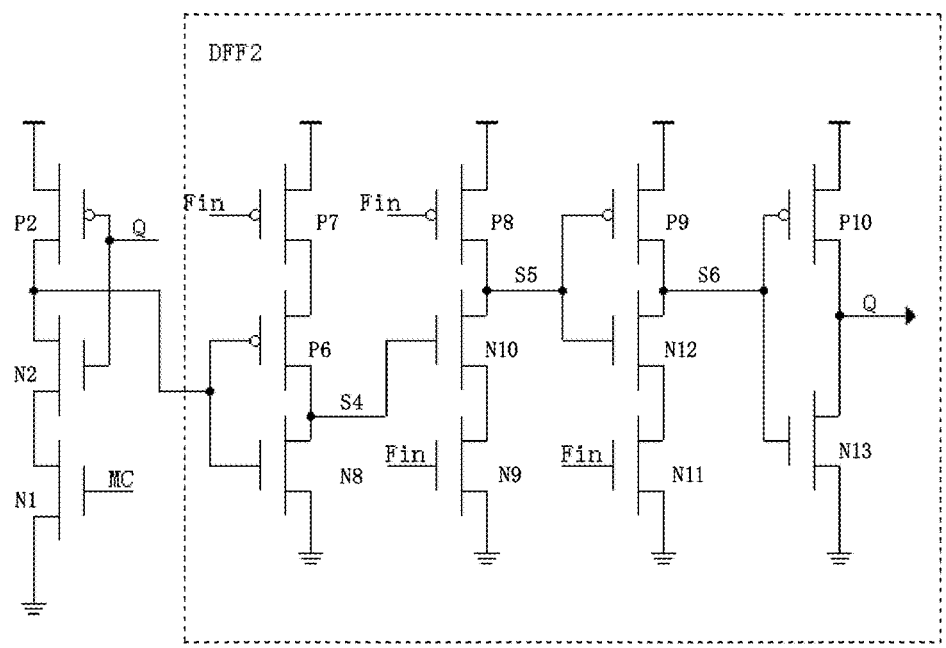
FIG. 5A shows an equivalent circuit of the frequency divider in accordance with one or more embodiments of the inventive concept working under a 2-division mode.
Figure 5B:
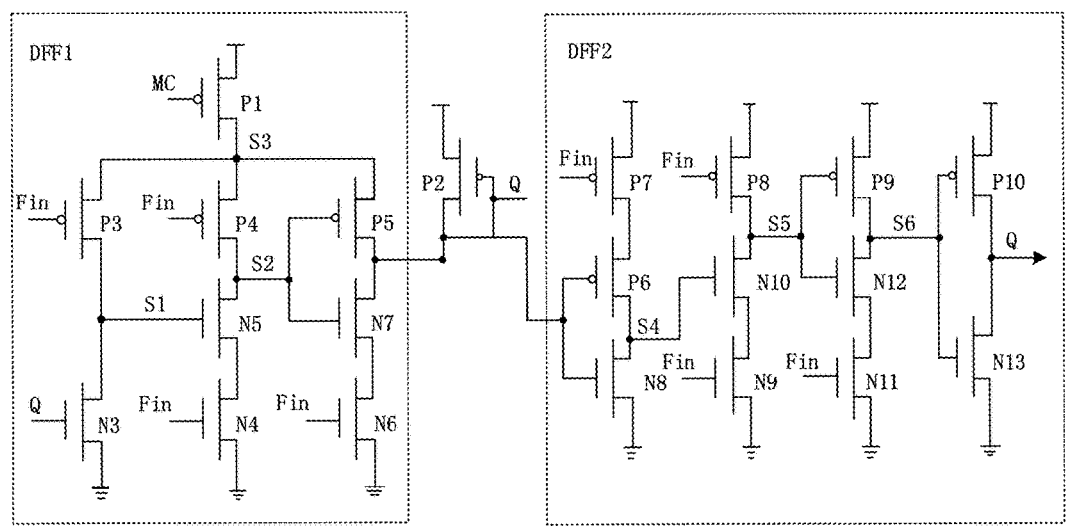
FIG. 5B shows an equivalent circuit of the frequency divider in accordance with one or more embodiments of the inventive concept working under a 3-division mode.

FIGS. 4, 5A, and 5B depict a frequency divider in accordance with one embodiment of this inventive concept. In this embodiment, both flip-flops are a D flip-flop.

Referring to FIG. 4, the frequency divider of this inventive concept comprises a first D flip-flop DFF1. A first part of the first D flip-flop DFF1 comprises an E-TSPC circuit to improve its operating speed, a second part and a third part of the first D flip-flop DFF1 both comprise a dynamic D latch with a TSPC circuit.

In one embodiment, the first D flip-flop DFF1 comprises a third pMOS transistor P3 and a third nMOS transistor N3. A source electrode of the third nMOS transistor N3 is grounded, a gate electrode of the third nMOS transistor N3 is connected to an input electrode of the first D flip-flop DFF1, a drain electrode of the third nMOS transistor N3 is connected to a drain electrode of the third pMOS transistor P3, both of these two drain electrodes are connected to a first node S1. A gate electrode of the third pMOS transistor P3 is connected to a timing signal Fin, a source electrode of the third pMOS transistor P3 is connected to a voltage node S3. The third pMOS transistor P3 and the third nMOS transistor N3 constitute the first part of the first D flip-flop DFF1, the first part of the first D flip-flop DFF1 comprises an E-TSPC circuit to improve the operating speed of the first D flip-flop DFF1.

Additionally, the first D flip-flop DFF1 further comprises a fourth nMOS transistor N4, a fifth nMOS transistor N5, and a fourth pMOS transistor P4. A source electrode of the fourth nMOS transistor N4 is grounded, a gate electrode of the fourth nMOS transistor N4 is connected to the timing signal Fin, a drain electrode of the fourth nMOS transistor N4 is connected to a source electrode of the fifth nMOS transistor N5. A gate electrode of the fifth nMOS transistor N5 is connected to the first node S1, a drain electrode of the fifth nMOS transistor N5 is connected to a drain electrode of the fourth pMOS transistor P4, both of these two drain electrodes are connected to a second node S2. A gate electrode of the fourth pMOS transistor P4 is connected to the timing signal Fin, a source electrode of the fourth pMOS transistor P4 is connected to the voltage node S3. The fourth nMOS transistor N4, the fifth nMOS transistor N5, and the fourth pMOS transistor P4 constitute the second part of the first D flip-flop DFF1.

Additionally, the first D flip-flop DFF1 further comprises a sixth nMOS transistor N6, a seventh nMOS transistor N7, and a fifth pMOS transistor P5. A source electrode of the sixth nMOS transistor N6 is grounded, a gate electrode of the sixth nMOS transistor N6 is connected to the timing signal Fin, a drain electrode of the sixth nMOS transistor N6 is connected to a source electrode of the seventh nMOS transistor N7. A drain electrode of the seventh nMOS transistor N7 and a drain electrode of the fifth pMOS transistor P5 are both connected to an output electrode of the first D flip-flop DFF1, a gate electrode of the seventh nMOS transistor N7 and a gate electrode of the fifth pMOS transistor P5 are both connected to the second node S2. A source electrode of the fifth pMOS transistor P5 is connected to the voltage node S3. The sixth nMOS transistor N6, the seventh nMOS transistor N7, and the fifth pMOS transistor P5 constitute the third part of the first D flip-flop DFF1. Both the second part and the third part of the first D flip-flop DFF1 comprise a dynamic D latch with a TSCP circuit.

In one embodiment, the frequency divider of this inventive concept further comprises a control module. The control module is connected to a control signal MC and controls the connection between the first D flip-flop DFF1 and the voltage source. As an example, the control module comprises a first pMOS transistor P1, wherein a drain electrode, a source electrode, and a gate electrode of the first pMOS transistor P1 is connected to the voltage node S3, the voltage source, and the control signal MC, respectively.

In one embodiment, the frequency divider of this inventive concept further comprises a second D flip-flop DFF2. The second D flip-flop DFF2 comprises a TSCP circuit.

The second D flip-flop DFF2 comprises an eighth nMOS transistor N8, a sixth pMOS transistor P6, and a seventh pMOS transistor P7. A source electrode of the eighth nMOS transistor N8 is grounded, a drain electrode of the eighth nMOS transistor N8 and a drain electrode of the sixth pMOS transistor P6 are both connected to a fourth node S4, a gate electrode of the eighth nMOS transistor N8 and a gate electrode of the sixth pMOS transistor P6 are both connected to an input electrode of the second D flip-flop DFF2. A source electrode of the sixth pMOS transistor P6 is connected to a drain electrode of the seventh pMOS transistor P7, a source electrode of the seventh pMOS transistor P7 is connected to the voltage source, a gate electrode of the seventh pMOS transistor P7 is connected to the timing signal Fin.

Additionally, the second D flip-flop DFF2 further comprises a ninth nMOS transistor N9, a tenth nMOS transistor N10, and an eighth pMOS transistor P8. A source electrode of the ninth transistor N9 is grounded, a gate electrode of the ninth nMOS transistor N9 is connected to the timing signal Fin, a drain electrode of the ninth nMOS transistor N9 is connected to a source electrode of the tenth nMOS transistor N10. A gate electrode of the tenth nMOS transistor N10 is connected to the fourth node S4, a drain electrode of the tenth nMOS transistor N10 and a drain electrode of the eighth pMOS transistor P8 are both connected to a fifth node S5. A gate electrode of the eighth pMOS transistor P8 is connected to the timing signal Fin, a source electrode of the eighth pMOS transistor P8 is connected to the voltage source.

Additionally, the second D flip-flop DFF2 further comprises an eleventh nMOS transistor N11, a twelfth nMOS transistor N12, and a ninth pMOS transistor P9. A source electrode of the eleventh nMOS transistor N11 is grounded, a gate electrode of the eleventh nMOS transistor N11 is connected to the timing signal Fin, a drain electrode of the eleventh nMOS transistor N11 is connected to a source electrode of the twelfth transistor nMOS N12. A gate electrode of the twelfth nMOS transistor N12 and a gate electrode of the ninth pMOS transistor P9 are both connected to the fifth node S5. A drain electrode of the twelfth nMOS transistor N12 and a drain electrode of the ninth pMOS transistor P9 are both connected to a sixth node S6. A source electrode of the ninth pMOS transistor P9 is connected to the voltage source.

Additionally, the second D flip-flop DFF2 further comprises a thirteenth nMOS transistor N13 and a tenth pMOS transistor P10. A source electrode of the thirteenth nMOS transistor N13 is grounded, a gate electrode of the thirteenth nMOS transistor N13 and a gate electrode of the tenth pMOS transistor P10 are both connected to the sixth node S6, a drain electrode of the thirteenth nMOS transistor N13 and a drain electrode of the tenth pMOS transistor P10 are both connected to an output electrode Q of the second D flip-flop DFF2, a source electrode of the tenth pMOS transistor P10 is connected to the voltage source.

In one embodiment, the frequency divider of this inventive concept further comprises a phase inverter. The phase inverter comprises a first nMOS transistor N1, a second nMOS transistor N2, and a second pMOS transistor P2. A source electrode of the first nMOS transistor N1 is grounded, a drain electrode of the first nMOS transistor N1 is connected to a source electrode of the second nMOS transistor N2, a gate electrode of the first nMOS transistor N1 is connected to a control electrode of the phase inverter. The control electrode of the phase inverter is connected to the control signal MC. A drain electrode of the second nMOS transistor N2 and a drain electrode of the second pMOS transistor P2 are both connected to an output electrode of the phase inverter, a source electrode of the second pMOS transistor P2 is connected to the voltage source, a gate electrode of the second pMOS transistor P2 and a gate electrode of the second nMOS transistor N2 are both connected to an input electrode of the phase inverter.

The input electrode of the first D flip-flop DFF1 is connected to the output electrode Q of the second D flip-flop DFF2. An output electrode of the first D flip-flop DFF1 is connected to the output electrode of the phase inverter. When the control signal MC is 1, the first pMOS transistor P1 is in a cutoff state, the first D flip-flop DFF1 is disconnected from the voltage source. When the control signal MC is 0, the first D flip-flop DFF1 is connected to the circuit. When the timing signal Fin is logic low (e.g. logic 0), a signal at the first node S1, which is a phase-inverted input signal, is sampled, the voltage at the second node S2 is a supply voltage Vdd, and the third part of DFF1 is at a "hold" state. When the timing signal Fin is logic high (e.g. logic 1), the sampled value at the first node S1 is transferred to the output electrode of the first D flip-flop DFF1.

The phase inverter comprises the first nMOS transistor N1, the second nMOS transistor N2, and the second pMOS transistor P2. The gate electrode of the first nMOS transistor N1 is connected to the control signal MC, the input electrode of the phase inverter is connected to the output electrode Q of the second D flip-flop DFF2, the output electrode of the phase inverter is connected to the output electrode of the first D flip-flop DFF1 and the input electrode of the second D flip-flop DFF2. When the control signal MC is logic high (e.g. logic 1), the phase inverter works normally, when the control signal MC is logic low (e.g. logic 0), both the first nMOS transistor N1 and the second nMOS transistor N2 are in a cutoff state, the second pMOS transistor P2 will be in a conducting state only when the signal at the output electrode Q of the second D flip-flop DFF2 is logic low (e.g. logic 0).

The input electrode of the second D flip-flop DFF2 is connected to the output electrode of the phase inverter. The output electrode Q of the second D flip-flop DFF2 is connected to the input electrode of the first D flip-flop DFF1 and the input electrode of the phase inverter. The second D flip-flop DFF2 has a same working mechanism as that of the first D flip-flop DFF1, that is, when the timing signal Fin is logic low (e.g. logic 0), an input signal is sampled; when the timing signal Fin is logic high (e.g. logic 1), the value of the sampled input signal is transferred to the output electrode Q of the second D flip-flop DFF2.

FIG. 5A shows an equivalent circuit of a frequency divider of this inventive concept working under 2-division mode, FIG. 5B shows an equivalent circuit of a frequency divider of this inventive concept working under 3-division mode.

There area number of characteristics of the frequency divider of this inventive concept. One characteristic is that when the frequency divider is working under 2-division mode, the first D flip-flop DFF1 is disconnected from the circuit, reducing the total power consumption of the circuit. Another characteristic is that the first part of the first D flip-flop DFF1 comprises an E-TSPC circuit. This way, adding the first pMOS transistor P1 to the first D flip-flop DFF1 can reduce the power consumption without significantly affecting the operating speed of the circuit. Yet another characteristic is that the transition from 2-division mode to 3-division mode of the frequency divider is realized by outputting a logic high signal on the second pMOS transistor P2 when the output signal of the second D flip-flop DFF2 is logic low, thus extending the duration of logic high in the output signal of the second D flip-flop DFF2 by one additional clock cycle. This transition does not rely on a logic operation result of the outputs of the first D flip-flop DFF1 and the second D flip-flop DFF2, as conventional frequency divider circuit does.

Figure 6:
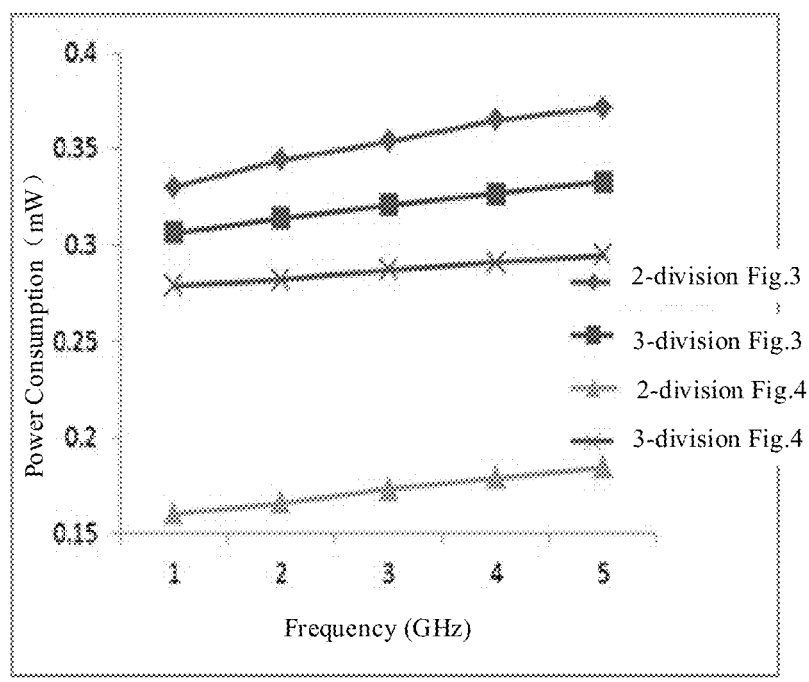
FIG. 6 shows a diagram depicting the power consumption of the frequency divider in accordance with one or more embodiments of the inventive concept, in comparison with the power consumption of the frequency divider depicted in FIG. 3 under 2-division and 3-division modes.

FIG. 6 shows a diagram depicting the power consumption of the frequency divider of this inventive concept, in comparison with the power consumption of a conventional frequency divider under 2-division and 3-division modes. In 2-division mode, the frequency divider of this inventive concept consumes 51% less power than a conventional frequency divider does. In 3-division mode, the frequency divider of this inventive consumes 10% less power than a conventional frequency divider does. Therefore the frequency divider of this inventive concept is a lower power consumption TSCP 2/3 division frequency divider.

As described above, the frequency divider of this inventive concept eliminates the logical OR gate circuit in conventional frequency dividers. The transition from 2-division mode to 3-division mode is realized by extending the logic high in the output signal by one additional clock cycle. Additionally, there is only one D flip-flop connected to the circuit when the frequency divider is working under 2-division mode. This design can reduce the power consumption of the frequency divider.

A Second Embodiment

This inventive concept further presents a frequency synthesizer comprising an aforementioned frequency divider.

In one embodiment, the frequency divider comprises a first flip-flop, a second flip-flop, and a phase inverter. An output electrode of the first flip-flop is connected to an input electrode of the second flip-flop and an output electrode of the phase inverter. An output electrode of the second flip-flop is connected to an input electrode of the phase inverter and an input electrode of the first flip-flop. A control electrode of the phase inverter is connected to a control signal. The first flip-flop is connected to a voltage source through a control module, the control module is also connected to the control signal and controls the connection between the voltage source and the first flip-flop.

When the control signal is a first-mode signal, the first flip-flop is disconnected from the voltage source, thus only the second flip-flop is connected and working, the frequency divider works under an N-division mode. When both the control signal and an output signal of the second flip-flop are a second-mode signal, the logic high in the second flip-flop output is extended by one additional clock cycle, the frequency divider works under an N+1-division mode.

The first flip-flop and the second flip-flop can be a D flip-flop or a T flip-flop. It may also be any other electrical circuits or elements that can provide the same functionality of the first and the second flip-flops. Optimally, both the first flip-flop and the second flip-flop can be a D flip-flop.

In one embodiment, the first flip-flop is a D flip-flop, a first part of the first flip-flop comprises an E-TSPC circuit to provide clock frequency, a second part and a third part of the first flip-flop both comprise a dynamic D latch with a TSPC circuit.

In one embodiment, the second flip-flop is a D flip-flop with a TSPC circuit.

Additionally, both the first and the second flip-flops may also comprise a timing electrode, which is connected to a timing signal Fin.

The circuit of the phase inverter can be any phase inverter circuit that is well known to a person of ordinary skills in the art, it can also be any other circuit that can change the phase of an input signal by 180 degree. The phase inverter of this inventive concept also has a control electrode that is connected to the control signal.

In one embodiment, the phase inverter comprises two nMOS transistors and one pMOS transistor. A gate electrode of one of the two nMOS transistors is connected to the control electrode of the phase inverter, which is also connected to the control signal MC, an input electrode of the phase inverter is connected to an output electrode of the second flip-flop, an output electrode of the phase inverter is connected to an output electrode of the first flip-flop and an input electrode of the second flip-flop. When the control signal MC is 1, the phase inverter works normally; when the control signal MC is 0, both of these two nMOS transistors are in a cutoff state, the pMOS transistor will be in a conducting state only when the output signal of the second flip-flop is 0.

The control module is connected to the control signal MC to control the connection between the first flip-flop and the voltage source. In one embodiment, the control module is a pMOS transistor, wherein a gate electrode, a source electrode and a drain electrode of the pMOS transistor is connected to the control signal MC, the voltage source, and the first flip-flop, respectively. When the control signal MC is a first-mode signal (e.g. 1), the pMOS transistor is in a cutoff state, and the first flip-flop is disconnected from the voltage source. The implementation of the control module is not limited to this embodiment, and other control circuits that can control the connection between the first flip-flop and the voltage source with a control signal can also be used as the control module in this inventive concept.

Additionally, the same control signal can be connected to both the control module and the phase inverter.

In this embodiment, N is an integer that is equal to or larger than 2. N can be set at 2, allowing this frequency divider to work as a 2/3 division frequency divider, a dual-modular frequency divider. When the control signal MC is the first-mode signal (e.g. 1), the control module disconnects the first flip-flop from the voltage source. When this happens, only the second flip-flop is connected to the circuit, thus this frequency divider works as a 2-division frequency divider. When both the control signal MC and the output signal of the second flip-flop are the second-mode signal (e.g. 0), both of the two nMOS transistors in the phase inverter are in a cutoff state and the pMOS transistor in the phase inverter is in a conducting state, which extends the logic high in the output signal of the second flip-flop by one additional clock cycle, the frequency divider works as a 3-division frequency divider.

In one embodiment, the frequency synthesizer can be a Phase-Lock Loop frequency synthesizer.

A complete Phase-Lock Loop frequency synthesizer may further comprises other circuits or elements, such as frequency discriminator, phase discriminator, charge pump, low-pass filter, or voltage controlled oscillator. These circuits or elements are omitted in this description in the interest of brevity.

The frequency divider of this inventive concept eliminates the logical OR gate circuit in conventional frequency dividers. The transition from 2-division mode to 3-division mode is realized by extending the logic high in the output signal by one additional clock cycle. Additionally, there is only one flip-flop connected to the circuit when working under 2-division mode, therefore this design can reduce the power consumption of the frequency divider and a Phase-Lock Loop frequency synthesizer comprising such a frequency divider.

While this inventive concept has been described in terms of several embodiments, there are alterations, permutations, and equivalents, which fall within the scope of this disclosure. There are also alternative ways of implementing the methods and apparatuses of the inventive concept. Furthermore, embodiments may find utility in other applications. The abstract section is provided herein for convenience and, due to word count limitation, is accordingly written for reading convenience and shall not be employed to limit the scope of the claims. It is therefore intended that the claims be interpreted as including all such alterations, permutations, and equivalents.

What is claimed is:

1. A frequency divider circuit, comprising:
   a first flip-flop;
   a second flip-flop;
   a phase inverter, wherein an output electrode of the first flip-flop is electrically connected to each of an input electrode of the second flip-flop, two gate electrodes of the second flip-flop, and an output electrode of the phase inverter, wherein an output electrode of the second flip-flop is electrically connected to each of an input electrode of the phase inverter, two gate electrodes of the phase inverter, and an input electrode of the first flip-flop, and wherein a control electrode of the phase inverter is connected to a control signal; and
   a control module, wherein the first flip-flop is connected to a voltage source through the control module, wherein the control module is connected to the control signal and controls the connection between the first flip-flop and the voltage source, and wherein when the control signal is a first-mode signal, the first flip-flop is disconnected from the voltage source, providing a functionality of a N-division frequency divider; when both the control signal and an output signal of the second flip-flop are a second-mode signal, a functionality of a N+1-division frequency divider is provided, wherein N is an integer greater than or equal to 2.

2. The circuit of claim 1, wherein the first flip-flop is a D flip-flop, and a first part of the first flip-flop comprises an Extended True Single-Phase Clock (E-TSPC) circuit.

3. The circuit of claim 2, wherein a second part and a third part of the first flip-flop both comprise a dynamic D latch with a True Single-Phase Clock (TSPC) circuit.

4. The circuit of claim 1, wherein the control module comprises:
   a first p-type Metal-Oxide-Semiconductor (pMOS) transistor, wherein a gate electrode of the first pMOS transistor is connected to the control signal, a drain electrode of the first pMOS transistor is connected to the first flip-flop, and a source electrode of the first pMOS transistor is connected to the voltage source.

5. The circuit of claim 1, wherein the phase inverter comprises:

a first n-type Metal-Oxide-Semiconductor (nMOS) transistor;
a second nMOS transistor; and
a second pMOS transistor, wherein a source electrode of the first nMOS transistor is grounded, a drain electrode of the first nMOS transistor is connected to a source electrode of the second nMOS transistor, a gate electrode of the first nMOS transistor is connected a control electrode of the phase inverter, a drain electrode of the second nMOS transistor and a drain electrode of the second pMOS transistor are both connected to an output electrode of the phase inverter, a source electrode of the second pMOS transistor is connected to the voltage source, a gate electrode of the second pMOS transistor and a gate electrode of the second nMOS transistor are both connected to an input electrode of the phase inverter.

6. The circuit of claim 1, wherein the second flip-flop is a D flip-flop with a TSPC circuit.

7. The circuit of claim 1, wherein the first-mode signal is 1 and the second-mode signal is 0.

8. The circuit of claim 1, wherein N is 2.

9. The circuit of claim 3, wherein the first flip-flop comprises:
a third pMOS transistor; and
a third nMOS transistor, wherein a source electrode of the third nMOS transistor is grounded, a gate electrode of the third nMOS transistor is connected to an input electrode of the first flip-flop, a drain electrode of the third nMOS transistor is connected to a drain electrode of the third pMOS transistor, and both are connected to a first node, a gate electrode of the third pMOS transistor is connected to a timing signal, a source electrode of the third pMOS transistor is connected to a voltage node of the first flip-flop.

10. The circuit of claim 9, wherein the first flip-flop further comprises:
a fourth nMOS transistor;
a fifth nMOS transistor; and
a fourth pMOS transistor, wherein a source electrode of the fourth nMOS transistor is grounded, a gate electrode of the fourth nMOS transistor is connected to the timing signal, a drain electrode of the fourth nMOS transistor is connected to a source electrode of the fifth nMOS transistor, a gate electrode of the fifth nMOS transistor is connected to the first node, the drain electrode of the fifth nMOS transistor and a drain electrode of the fourth pMOS transistor are both connected to a second node, a gate electrode of the fourth pMOS transistor is connected to the timing signal, a source electrode of the fourth pMOS transistor is connected to the voltage node.

11. The circuit of claim 10, wherein the first flip-flop further comprises:
a sixth nMOS transistor;
a seventh nMOS transistor; and
a fifth pMOS transistor, wherein a source electrode of the sixth nMOS transistor is grounded, a gate electrode of the sixth nMOS transistor is connected to the timing signal, a drain electrode of the sixth nMOS transistor is connected to a source electrode of the seventh nMOS transistor, a drain electrode of the seventh nMOS transistor and a drain electrode of the fifth pMOS transistor are both connected to an output electrode of the first flip-flop, a gate electrode of the seventh nMOS transistor and a gate electrode of the fifth pMOS transistor are both connected to the second node, a source electrode of the fifth pMOS transistor is connected to the voltage node.

12. The circuit of claim 6, wherein the second flip-flop further comprises:
an eighth nMOS transistor;
a sixth pMOS transistor; and
a seventh pMOS transistor, wherein a source electrode of the eighth nMOS transistor is grounded, a drain electrode of the eighth nMOS transistor and a drain electrode of the sixth pMOS transistor are both connected to a fourth node, a gate electrode of the eighth nMOS transistor and a gate electrode of the sixth pMOS transistor are both connected to an input electrode of the second D flip-flop, a source electrode of the sixth pMOS transistor is connected to a drain electrode of the seventh pMOS transistor, a source electrode of the seventh pMOS transistor is connected to the voltage source, a gate electrode of the seventh pMOS transistor is connected to the timing signal.

13. The circuit of claim 12, wherein the second flip-flop further comprises:
a ninth nMOS transistor;
a tenth nMOS transistor; and
an eighth pMOS transistor, wherein a source electrode of the ninth nMOS transistor is grounded, a gate electrode of the ninth nMOS transistor is connected to the timing signal, a drain electrode of the ninth nMOS transistor is connected to a source electrode of the tenth nMOS transistor, a gate electrode of the tenth nMOS transistor is connected to the fourth node, a drain electrode of the tenth nMOS transistor and a drain electrode of the eighth pMOS transistor are both connected to a fifth node, a gate electrode of the eighth pMOS transistor is connected to the timing signal, a source electrode of the eighth pMOS transistor is connected to the voltage source.

14. The circuit of claim 13, wherein the second flip-flop further comprises:
an eleventh nMOS transistor;
a twelfth nMOS transistor; and
a ninth pMOS transistor, wherein a source electrode of the eleventh nMOS transistor is grounded, a gate electrode of the eleventh nMOS transistor is connected to the timing signal, a drain electrode of the eleventh nMOS transistor is connected to a source electrode of the twelfth nMOS transistor, a gate electrode of the twelfth nMOS transistor and a gate electrode of the ninth pMOS transistor are both connected to the fifth node, a drain electrode of the twelfth nMOS transistor and a drain electrode of the ninth pMOS transistor are both connected to a sixth node, a source electrode of a ninth pMOS transistor is connected to the voltage source.

15. The circuit of claim 14, wherein the second flip-flop further comprises:
a thirteenth nMOS transistor; and
a tenth pMOS transistor, wherein a gate electrode of the thirteenth nMOS transistor and a gate electrode of the tenth pMOS transistor are both connected to the sixth node, a source electrode of the thirteenth nMOS transistor is grounded, a drain electrode of the thirteenth nMOS transistor and a drain electrode of the tenth pMOS transistor are both connected to an output electrode of the second flip-flop, a source electrode of the tenth pMOS transistor is connected to the voltage source.

16. A frequency synthesizer circuit, comprising:
a frequency divider circuit, wherein the frequency divider circuit comprises:
a first flip-flop;
a second flip-flop;
a phase inverter, wherein an output electrode of the first flip-flop is electrically connected to each of an input electrode of the second flip-flop, two gate electrodes of the second flip-flop, and an output electrode of the phase inverter, wherein an output electrode of the second flip-flop is electrically connected to each of an input electrode of the phase inverter, two gate electrodes of the phase inverter, and an input electrode of the first flip-flop, and wherein a control electrode of the phase inverter is connected to a control signal; and
a control module, wherein the first flip-flop is connected to a voltage source through the control module, wherein the control module is connected to the control signal and controls the connection between the first flip-flop and the voltage source, and wherein when the control signal is a first-mode signal, the first flip-flop is disconnected from the voltage source, providing a functionality of a N-division frequency divider; when both the control signal and an output signal of the second flip-flop are a second-mode signal, a functionality of a N+1-division frequency divider is provided, wherein N is an integer greater than or equal to 2.

17. The circuit of claim 16, wherein the first flip-flop is a D flip-flop, and a first part of the first flip-flop comprises an Extended True Single-Phase Clock (E-TSPC) circuit.

18. The circuit of claim 17, wherein a second part and a third part of the first flip-flop both comprise a dynamic D latch with a True Single-Phase Clock (TSPC) circuit.

19. The circuit of claim 16, wherein the control module comprises:
a first pMOS transistor, wherein a gate electrode of the first pMOS transistor is connected to the control signal, the drain electrode of the first pMOS transistor is connected to the first flip-flop, a source electrode of the first pMOS transistor is connected to the voltage source.

20. The circuit of claim 16, wherein the phase inverter comprises:
a first nMOS transistor;
a second nMOS transistor; and
a second pMOS transistor, wherein a source electrode of the first nMOS transistor is grounded, a drain electrode of the first nMOS transistor is connected to a source electrode of the second nMOS transistor, a gate electrode of the first nMOS transistor is connected to a control electrode of the phase inverter, a drain electrode of the second nMOS transistor and a drain electrode of the second pMOS transistor are both connected to an output electrode of the phase inverter, a source electrode of the second pMOS transistor is connected to the voltage source, a gate electrode of the second pMOS transistor and a gate electrode of the second nMOS transistor are both connected to an input electrode of the phase inverter.

* * * * *